United States Patent [19] [11] Patent Number: 4,931,996
Yasuda [45] Date of Patent: Jun. 5, 1990

[54] SEMICONDUCTOR MEMORY DEVICE

[75] Inventor: Hirofumi Yasuda, Suwa, Japan

[73] Assignee: Seiko Epson Corporation, Tokyo, Japan

[21] Appl. No.: 360,611

[22] Filed: Jun. 2, 1989

Related U.S. Application Data

[63] Continuation of Ser. No. 114,311, Oct. 27, 1987, abandoned.

[30] Foreign Application Priority Data

Oct. 27, 1986 [JP] Japan ................. 61-164538
Jun. 30, 1987 [JP] Japan ................. 62-163497

[51] Int. Cl.$^5$ ............................... G11C 7/00
[52] U.S. Cl. ..................... 365/189.09; 365/208; 365/210
[58] Field of Search ............ 365/189.07, 189.09, 365/207, 208, 210

[56] References Cited

U.S. PATENT DOCUMENTS 4,301,518 11/1981 Klaas ......................... 365/207 X

OTHER PUBLICATIONS

"An 80 ns 1 Mb ROM" by Fujio Masuoka, et al., 1984, IEEE International Solid-State Circuits Conference, pp. 146, 147 and 329.
"4M Bit Mask ROM And The Application Therefore", by Shoichi Tsujita, Electronic Parts and Materials, published 1/1/86, pp. 104–108.

Primary Examiner—Joseph A. Popek
Attorney, Agent, or Firm—Blum Kaplan

[57] ABSTRACT

A semiconductor memory device for reading stored data from a selected memory cell in the semiconductor device to a sensing amplifier. An array of memory cells is arranged in a matrix, each memory cell including a MOS transistor. Word lines are organized to select groups of the MOS transistors. A plurality of first bit lines are arrayed in a matrix with the word lines. The word lines and bit lines together select the selected memory cell from the array. Each first bit line is coupled to either the source electrode or drain electrode of a plurality of MOS transistors. There is at least one second bit line. Each second bit line is selectively coupled to at least two corresponding first bit lines. A first bit line selection circuit selectively couples one of the first bit lines to a corresponding second bit line. A first power source line is coupled to the other of the source and drain of the array of the MOS transistors. A second bit line select means selectively couples a second bit line to the sensing amplifier.

45 Claims, 6 Drawing Sheets

SEMICONDUCTOR MEMORY DEVICE

This is a continuation of application Ser. No. 07/114,311 filed on Oct. 27, 1987, now abandoned.

BACKGROUND OF THE INVENTION

The invention is generally directed to a semiconductor device including a memory cell array composed of MOS transistors and selection circuitry and in particular to a semiconductor device which provides improved miniaturization and improved speed of operation by reducing the stray capacitance of the bit line.

Reference is made to FIG. 1 wherein a structural block diagram of a semiconductor memory device 100 utilizing MOS transistors is depicted. The address input data is input to memory device 100 at column input terminal 11 and row input terminal 12. The row and column data input to input terminals 11, 12 selects a particular memory cell (MOS transistor) within memory cell array 18. Memory device 100 then outputs the contents of the selected memory cell at data output terminal 13. The row input data entering at row input terminal 12 enters row address input buffer 16 and then row decoder 17 which selects an appropriate row of memory cells and memory cell arrays which are output to bit line select circuit 19. The column address input data which is input to column input terminal 11 moves through column address input buffer 14 to column decoder 15, which selects the appropriate memory cell on the selected row for output to data output circuit 20. Column decoder 15 detects the data written in the memory cell which is output to data output terminal 13.

Row decoder 17 operates by making one row decoder output line, namely the selected word line, equal to a selected level. Likewise, column decoder 15 sets one of the column decoder output lines (bit lines) equal to a selected level, thereby allowing selection of the appropriate word and bit line to which the memory cell specified by the row and column address data is connected. Thus, the selection of the appropriate word line and the appropriate bit line specifies a single memory cell in the array and the contents of that memory cell is detected and output.

The discussions of the semiconductor memory devices, which follows utilizes the example of a Read Only Memory (ROM), although other types of memory devices such as EPROM and EEPROM devices having a floating gate structure among others may be substituted. The ROM structure is used for purposes of explanation as a result of its relative simplicity. In the ROM arrangement, a ROM mask is used to write data to the memory cell which is composed of a MOS transistor. The ROM mask is a photoetching mask which is utilized in the manufacturing process. In memory cells made by utilizing a mask ROM, two methods of manufacture are generally used. The first is the contact window method and the second is the diffusion layer method. In both of these arrangements the memory cell is structured so that the memory cells are connected between a bit line and ground in parallel.

Reference is made to FIG. 2 wherein a memory cell structure in accordance with the diffusion layer method is shown. A word line 59 selects the appropriate row and becomes the gate electrode of the MOS transistor. The oxide film is generally a LOCOS (localized oxidation of silicon) formed of silicon dioxide. Bit lines 60 are formed of a metal material. A difference of an oxide film 62 is used to form the diffusion layer of the MOS transistor. Bit line 60 is coupled to the drain terminal of the MOS transistor (the memory cell) through a contact hole 61. In the semiconductor memory structure of FIG. 2, the diffusion layers forming the source and drain electrodes of the MOS transistor are formed by the self aligned word line 59 and the difference of the oxide film 62. The overlapped portion of word line 59 and oxide film 62 form the channel portion of the MOS transistor. To write data into the structure, the oxide film of the channel portion, which is marked in FIG. 2 with broken line is thickened by masking thereby forming a transistor which will not operate. In this way, depending upon the operability of the MOS transistor, binary information is memorized. That is, a current will either flow through the MOS transistor from the bit line to the ground line or prevent the flow of such current when the gate electrode is energized. The oxide film portion 62 is connected to ground. The same is applicable for the oxide film portion on the opposite side which is not seen in FIG. 2.

Another method of forming a ROM semiconductor memory device is by utilizing an ion implantation method of the type described in *Electronic Material*, pp. 104–108, January 1986. Reference is made to FIG. 3 wherein a portion of a semiconductor memory device 70 produced in accordance with the ion implantation method is shown. First gate electrodes 63 are formed of a first layer of polycrystalline silicon. Second gate electrodes 64 are formed with second layers of polycrystalline silicon between the first layers of polycrystalline silicon making up first gate electrodes 63. Thus, by also forming transistors between the first gate electrodes, the integrated degree is eliminated. Ion implantation is performed under predetermined electrodes, thereby changing the threshold voltage (portions which are marked with diagonal shading lines in FIG. 3). A bit line 65 is formed of metal. A difference of the oxide film 66 is used to form the diffusion layer and the MOS transistor. Diffusion layer 66 is connected to bit line 65 through a contact hole 67. Group 68 is coupled to a word line and grouping 69 is coupled to a select line for the group of memory cells which are connected in series. In the ROM of FIG. 3, the MOS transistors (which are the memory cells) are connected in series with respect to the ground lines, and memory cell groups (in series) are connected to a bit line in parallel. This type of device is identified as a series-parallel type device.

In the above described generally known ROMs, the impedance between the bit line and the ground line changes in accordance with the existence of the contact hole, the diffusion layer and the particular ion implantation performed. Thus, comparison of the impedance is performed by the bit line and column select circuits, thereby extracting the data from a selected memory cell.

Generally, the minimum size of a design parameter (the design rule) is determined by the accuracy of the photoetching in the manufacturing process. Therefore, in the case of a 2 $\mu$m design rule, the width of an electrode is 2 $\mu$m, the contact hole is 2 $\mu$m and the base size is also 2 $\mu$m. However, where portions of the device must overlap other portions in the photoetching process, for example, the overlapped portion of contact hole 61 and the difference of the oxide film 62 and metal bit line 60 (FIG. 2), require expansion of the circuit elements. As a result, it is necessary that contact hole 61 be aligned with respect to oxide film 62 and gate electrode (word line) 59 which has been previously formed. Then the metal must be aligned with respect to the contact hole. As a result, problems with alignment accuracy occur. A spacing margin is thus required around contact hole 61 in oxide film 62 and gate electrode 59 to overcome problems with alignment accuracy and size variation when the oxide film 62 shown in FIG. 2 is formed. As a result, although the design rule is 2 μm, the difference of the oxide film 62 is made considerably larger the 2 μm due to the need to assure alignment with the contact hole. Accordingly the size of the diffusion layer is made about 5 μm, more than twice the size of the design rule to assure reliable manufacturing.

Even where the alignment accuracy of the oxide film and the contact hole can be ignored by forming the diffusion layer by ion implantation after formation of the contact hole, problems with alignment accuracy of the contact hole and the metal still occur which increase the size of the memory cell. Generally, the metal used is aluminum. However, because the aluminum particles are relatively large, the aluminum at the contact portion generally is as large as the size of the oxide film 62.

The series-parallel type ROMs as shown in FIG. 3 have a structure including two layers of gates. That is, they utilize a first gate electrode and a second gate electrode which reduces the degree of integration of the memory cells. It is necessary that the spaces in the mask (the portion which will be implanted and are marked with the diagonal lines in FIG. 3) be aligned with the appropriate gate electrodes. As a result, to assure accuracy, the minimum value of the design rule is not utilized and the cell size is increased.

Since the four groups of memory cells connected in series are coupled to one contact in memory device 70 shown in FIG. 3, it is possible to form the oxide film of the memory cell portion, that is the width of the channel region at the minimum value, i.e. at the design rule. However, in order to select one of the two groups of memory cell series by two select lines, ion implantation is performed under one select line, thereby forming a depletion type MOS transistor. Further, on the opposite side, since two groups of the series MOS transistors are connected through the selection circuit in the same manner, the stray capacitance of the diffusion layer of the contact portion and the stray capacitance of the two depletion type MOS transistors are added to the bit line. Thus, in order to connect two groups of the memory cells in series on one side, the diffusion layer whose size is more than three times as large as the minimum dimension of the design rule, is formed on the contact portion. The diffusion layer portion of the contact region extends to the separated portion where the two groups of memory cell series are formed. Thus, even though the width of the channel regions are formed at the minimum value (design rule), the inclusion of the diffusion layer above the MOS transistor portion causes the stay capacitance of the bit line to become extremely large.

As a result, in the series-parallel type of FIG. 3, the MOS transistors are connected in series, thereby increasing the impedance from the bit line 65 to the ground line, making the operation of the series-parallel type device much slower than the parallel type. Moreover, the bit line stray capacitance is substantially increased, causing a further deterioration in the speed of operation. In the parallel type memory structure shown in FIG. 2, half of the contact regions associated with the plurality of memory cells connected to a bit line are added to the stray capacitance of one bit line. This causes a significant deterioration of operating speed due to the large stray capacitance present.

Accordingly, there is a need to speed up the operation of the memory device by reducing the stray capacitance of the bit line and maintaining a highly integrated miniaturized semiconductor memory device at the scale of the design rule.

SUMMARY OF THE INVENTION

The invention is generally directed to a semiconductor memory device for reading stored data from a selected memory cell in the semiconductor memory device to a sensing amplifier. An array of memory cells are arranged in a matrix with each of the memory cells including a MOS transistor. Word lines are organized to select groups of the MOS transistors. A plurality of first bit lines are arranged in the matrix with the word lines. Together, the first bit lines and the word lines select the selected memory cells from the array. Each first bit line is coupled to either the source or drain of a plurality of MOS transistors. Each of the memory cells is coupled to a first bit line. There are at least two second bit lines. Each second bit line is selectively coupled to at least two corresponding first bit lines. A first bit line selecting circuit selectively couples one of the first bit lines to a corresponding second bit line. A power source line is coupled to the other of the source or drain of the array of MOS transistors than the first bit lines. A second bit line selecting circuit selectively couples a second bit line to the sensing amplifier.

Accordingly, it is an object of the invention to provide an improved semiconductor memory device.

Another object of the invention is to provide an improved semiconductor memory device which speeds up the operation of the device by reducing the stray capacitance of the bit line.

A further object of the invention is to provide an improved semiconductor memory device where the bit line is composed of a first bit line formed of polycrystalline silicon and a second bit line formed of metal to produce a memory cell on the scale of the minimum size of the design rule.

Still another object of the invention is to provide an improved semiconductor memory device which reduces the stray capacitance of the bit line by connecting the first bit lines to the second bit lines through a selection circuit without concurrent increase in the size of the memory cells or memory device.

Yet another object of the invention is to provide a semiconductor memory device which has a reduced chip size and a reduction in the access time of the memory device to produce a high access speed memory device.

Yet a further object of the invention is to provide a semiconductor memory device which reduces the stray capacitance of the bit line by using a plurality of first bit lines of polycrystalline silicon and a lesser number of metal second bit lines which are selectively coupled to one of the first bit lines.

Still a further object of the invention is to provide a semiconductor memory device in which the size of the memory cell is equal to the minimum of the size of the design rule.

A further object of the invention is to provide a semiconductor memory device in which the first bit lines are connected to the second bit lines through a selection circuit thereby substantially reducing the stray capacitance of the bit lines without a corresponding increase in size of the memory cell.

Still another object of the invention is to provide a semiconductor memory device which reduces the chip size and shortens memory access time.

Yet another object of the invention is to provide a semiconductor memory device manufactured by a self-aligned method which produce a high speed, large capacity integrated circuit semiconductor memory device suitable for miniaturization.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENT

Figure 4:
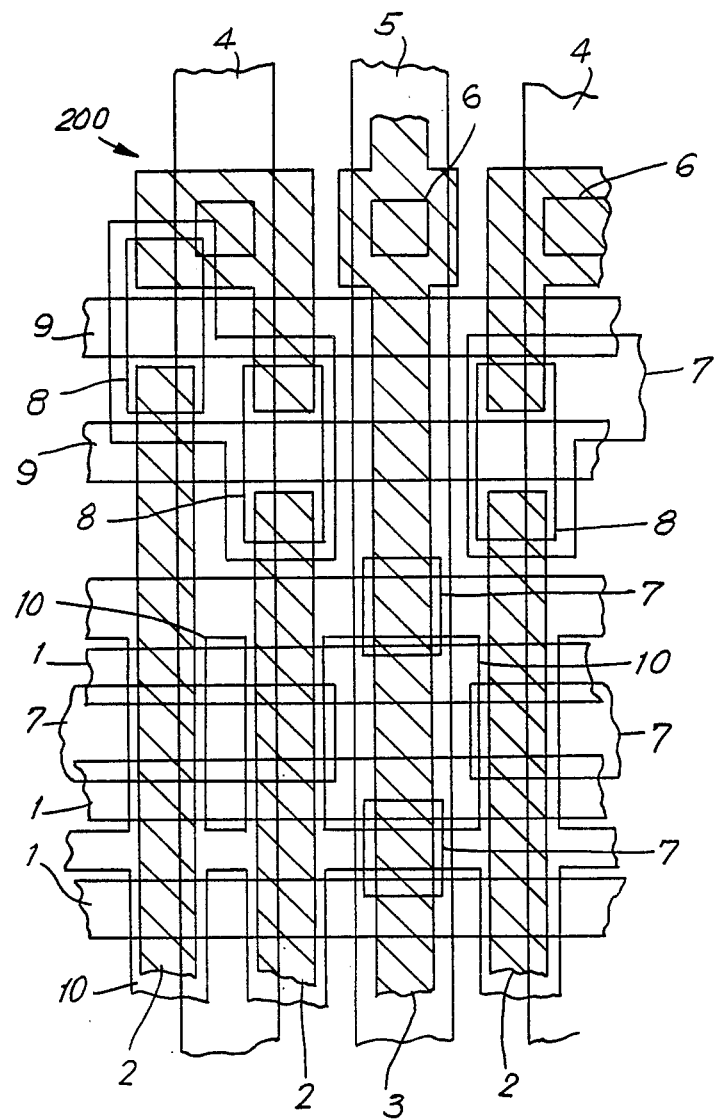
FIG. 4 is a partial, cutaway plan view of a portion of a semiconductor memory device in accordance with the invention.

Reference is made to FIG. 4 wherein a semiconductor memory device, generally indicated as 200, constructed in accordance with the invention is depicted. FIG. 4 is a generally plan view. However, elements which are covered by other elements are shown with solid lines, relative vertical positioning being shown in FIG. 5. A first bit line 2 is formed as polycrystalline silicon. A word line 1 also forms the gate electrodes of the MOS transistors which make up semiconductor memory device 200. First bit line 2, which is formed of polycrystalline silicon, is adapted to have impurities diffused therein. A first source line 3 is also formed of polycrystalline silicon. First source line 3 is connected to the source electrodes of the MOS transistors. The MOS transistors are the memory cells. The polycrystalline silicon first source line 3 also has an impurity diffused to form the source electrode. A second bit line 4 is formed of metal, generally aluminum. A second source line 5 adapted to be connected to the source electrodes of the MOS transistors through first source line 3 is formed of a metal, such as aluminum. A contact hole 6 connects the polycrystalline silicon of first source line 3 to the metal of second source line 5. Contact holes 7 are for connecting the polycrystalline silicon of first bit lines 2 to the diffusion layer 10 which is the drain of the MOS transistor by a buried contact as described below in greater detail. A difference of the oxide film 8· is used to form the selection circuit for selecting which of the first bit lines 2 will be connected to the second bit line 4. Gate electrodes 9 are the selection lines for the first bit lines.

Figure 5:
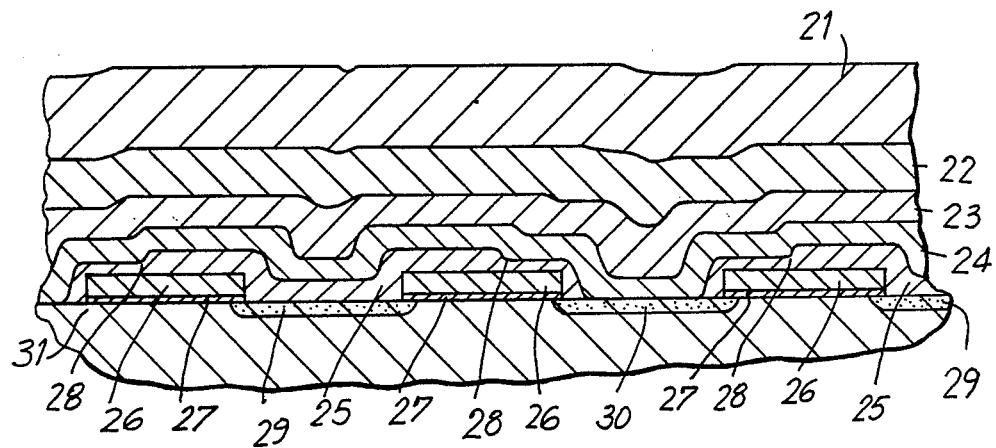
FIG. 5 is a cutaway sectional view of memory cells formed in accordance with the invention.

Reference is next made to FIG. 5 wherein a sectional view of a small portion of the memory cells of semiconductor memory device 200 is depicted. A passivation film 21 which reduces coaction of the semiconductor memory device with outside influences such as electrical circuit and light rests on top of the other layers. Directly underneath passivation film 21 is a metal wiring layer 22. Metal wiring layer 22 includes at different locations second bit line 4 and second source line 5. The locations of second bit lines 4 and second source line 5 are patterned and etched. Underneath metal wiring layer 22 is an insulating film layer 23 between metal wiring layer 22 and a polycrystalline silicon wiring layer 24. Polycrystalline silicon wiring layer 24 includes first bit line 2 and first source line 3. While layers 22 and 24 are shown as continuous layers at this section (FIG. 5), the shapes of the layers are controlled by the masks and photoetching processes involved in patterning the semiconductor and metal layers. In addition, there are contact points between the second bit line 4 and second source line 5 of layer 22 and the first bit line 2 and first source line 3 of layer 24 through layer 23 as shown in. FIG. 4. An insulating film layer 25 separates polycrystalline silicon wiring layer 24 and gate electrodes 26. A gate oxide film 27 separates gate electrodes 26 from diffusion layers 29 and 30 and silicon substrate 31. A difference of the hole 28, which results in insulating layer 25 protecting the side of gate electrodes 26 when a buried contact is made is shown between polycrystalline silicon layer 24 and diffusion region 30. The manner in which the difference in the hole 28 is formed is described below with respect to FIGS. 6A-C.

One method of forming a buried contact is briefly described, although other methods are applicable. After forming the oxide film for the MOS transistor, the gate oxide film is grown. Then, the material from which the gate electrode (and word line) is formed, e.g. polycrystalline silicon is grown over the entire substrate. Then, an oxide film is grown on top of this. Next, the photoetching of the gate electrode is performed and then the source and drain electrodes are formed by thermal diffusion or ion implantation. If the oxide film is grown all over the substrate, the gate electrode is thicker than the diffusion layer because the oxide film remains on the gate electrode. In this situation, photoetching of the oxide film over the diffusion region is performed with the same technology used for forming LDD (lightly doped drain) structure which is used for extremely miniaturized MOS transistor technology by leaving the oxide film on the side wall of the gate electrode. Then, polycrystalline silicon is grown on the hole which has been opened above the diffusion region and pattern forming is performed by photoetching. Thereafter, the layer insulating film, contact hole and metal are formed in the same order as in a standard MOS transistor's structure.

Figure 6A:
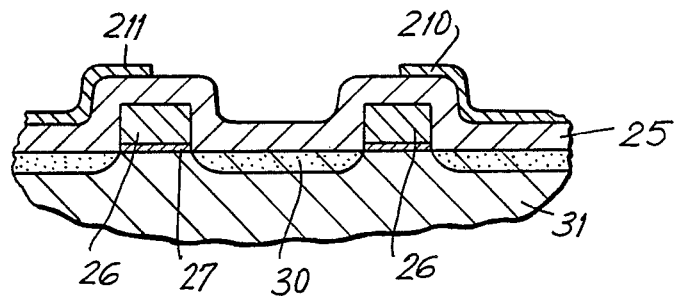
FIGS. 6A, 6B and 6C are sequential sectional views showing the formation of a buried contact for a memory cell in accordance with the invention.
Figure 6B:
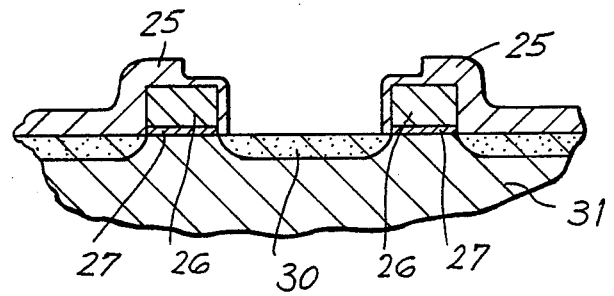
Figure 6C:
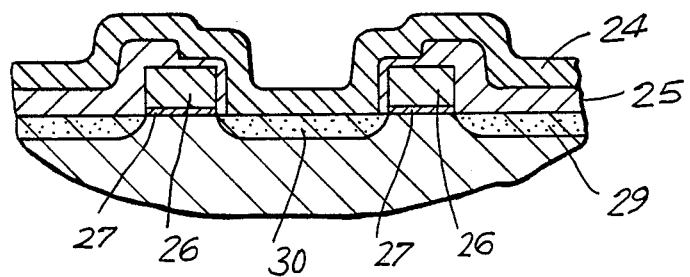

In FIGS. 6A-6C, the method of forming the buried polycrystalline silicon contact with diffusion region 30 is shown. In FIG. 6A, after a silicon dioxide insulating layer 25 is grown on gate electrode 26 and the silicon dioxide has grown all over the surface, masks 210, 211 are utilized. Then, as shown in FIG. 6B, anisotropic etching is performed. As can be clearly seen, the sides of gate electrodes 26 adjacent to the opened contact hole are still covered by a insulating layer 25. This protects the integrity of gate electrode 26, particularly in highly miniaturized transistor structures where destruction of the upper portion of the gate electrode is otherwise possible.

Finally, as shown in FIG. 6C, polycrystalline silicon, which forms the first bit line (or first source line), is grown, forming a solid and accurate buried contact between diffusion layer 30 and polycrystalline silicon layer 24. A buried contact is thus formed in accordance with a self aligned method which avoids the need for enlargement of circuit elements beyond the scale of the design rule.

Thus, in the buried contact described above with respect to FIGS. 6A-6C, a thick oxide film is grown on the gate electrode and the hole is formed by a self aligned method with respect to the gate electrode and diffusion layers while retaining bits of the oxide film on the side walls of the gate electrode while making a hole. As a result, additional alignment space between the gate electrode and diffusion layer is not needed. Thus, the pattern forming of the wiring layer of the gate electrodes, the diffusion layer and the polycrystalline silicon wiring line can be maintained at the minimum scale of the design rule.

Polycrystalline silicon, however, has higher resistance than does the metal (e.g. aluminum). As a result, when the size of the semiconductor memory device increases, the value of the resistance becomes too large to be ignored. As a result, in the present invention, the polycrystalline silicon forming first bit line 2 is connected to metal second bit line 4 through a first bit line select circuit 8, 9 in FIG. 4. Thus, it is only necessary to arrange the selection circuit taking into account the resistance value of the polycrystalline silicon and the impedance of a MOS transistor, which forms the memory cell. Further, it is only necessary to add a limited number of MOS transistors for the selection circuit, which does not cause a significant increase in the size of the semiconductor memory device.

Moreover, as shown in FIG. 4, one of the MOS transistors of the selection circuit is formed on one of the first bit lines 2 by oxide film 8 which is adapted to form two MOS transistors. The second bit line 4 is connected to the wide polycrystalline silicon layer where the buried contacts connect the two MOS transistors. The size of the contact hole which connects the metal of second bit line 4 to the first bit line select circuit and the wide metal wiring layer 4 do not effect the overall size of the memory cell.

The second bit line has stray capacitance composed of six separate components. The first component is the stray capacitance between metal second bit line 4 (layer 22 in FIG. 5) and diffusion layer 10. The second component is the stray capacitance between metal second bit line layer 22 and substrate 31 (FIG. 5). The third component is the stray capacitance between metal second bit line layer 22 and gate electrodes 26. The fourth component is the stray capacitance between metal second bit line layer 22 and first bit line 2 (layer 24 in FIG. 5). The fifth component is the stray or parasitic capacitance of the selected first bit line. This component is itself composed of three separate components: the stray capacitance between the diffusion layer of the memory cell transistor and the substrate; the stray capacitance between the polycrystalline silicon which forms the first bit line and the diffusion layer; and the stray capacitance between the polycrystalline silicon which forms the first bit line and the gate electrode. The sixth component is the stray or parasitic capacitance of the first bit line select circuit which is composed of the stray capacitance between the diffusion layer of the selection circuit and the substrate.

While the stray capacitance of the second bit line appears to be significant in view of the large number of components, the stray capacitance of the metal second bit line is actually quite small due to the thickness of insulating layer 23. As a result, the stray capacitance of metal second bit line 4 (layer 22 in FIG. 5) is actually significantly smaller than the stray capacitance of the bit lines in conventional semiconductor memory devices of the type described above. As the stray capacitance between the diffusion layer of the memory cell and the substrate becomes smaller in direct relationship to the separation from the bit line, the stray capacitance of the second bit line is reduced at a rate directly related to the amount of separation therebetween. Even though the stray capacitance between the diffusion layer of the selection circuit and the substrate is added to the stray capacitance of the second bit line, the desired significant reduction in stray capacitance of the second bit line with respect to conventional semiconductor memory devices is achieved.

Figure 1:
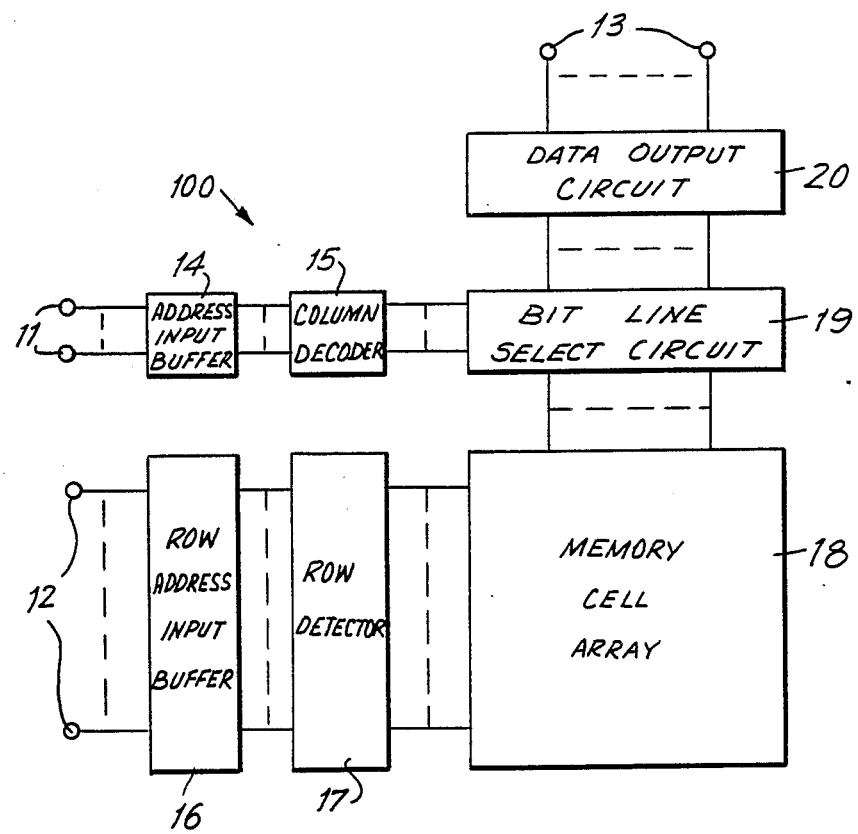
FIG. 1 is a functional block diagram of a semiconductor memory device.
Figure 2:
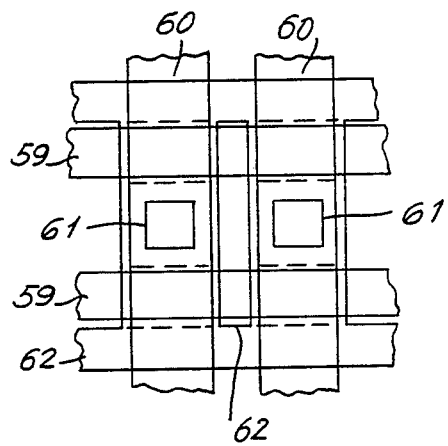
FIG. 2 is a cutaway plan view of a portion of a semiconductor memory device in accordance with the prior art.
Figure 3:
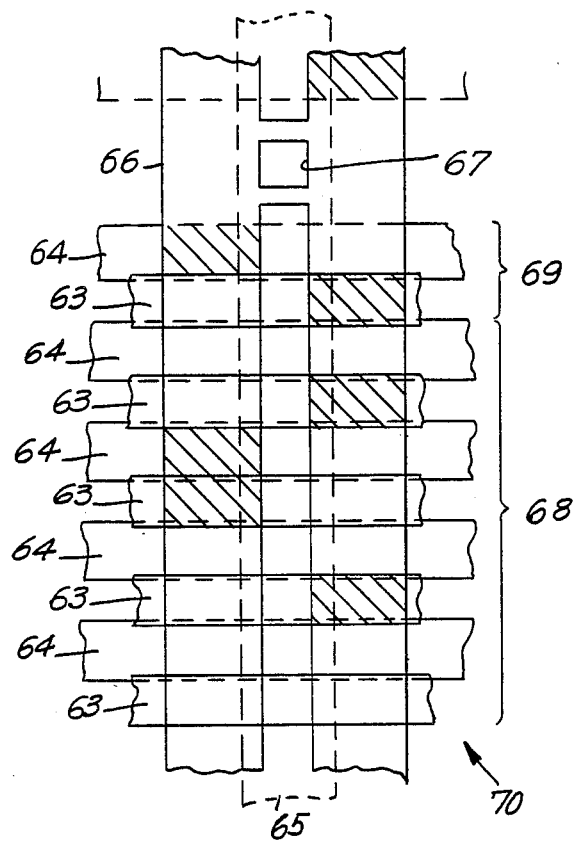
FIG. 3 is a cutaway partial plan view of a semiconductor memory device in accordance with the prior art.

In the series-parallel type of semiconductor memory circuit shown in FIG. 3 utilizing the first and second gate electrodes, described above, alignment accuracy between the ion implantation mask used to store data in the device and the gate electrode is required for each of the gate electrodes. Where miniaturization advances are obtained, the self-aligned method can be used to form the memory cell thereby further reducing the size of the memory cell. However, this series-parallel type semiconductor memory device suffers from very high impedance which significantly slows the operation of the device.

The discussion above with respect to the physical separation of the first bit line from the second bit line except at contact points to significantly reduce the stray capacitance associated by the separation of the first and second bit line can also be achieved with the second source lines. The polycrystalline silicon which becomes the first source is connected to the source of the N-channel MOS transistor, which is the memory cell, by a buried contact in the same way that the first bit is coupled to diffusion layer 30 in FIG. 5. The polycrystalline silicon which forms the first source line (layer 24) is connected to the metal which forms the second source line (layer 22). The stray capacitance of the metal second source line is similarly reduced over the prior art devices as described above with respect to the second bit line.

Thus, as described, the portions of the memory cell which are directly connected to each other are all formed of polycrystalline silicon. The gate electrode, first bit line and first source lines are all formed of the polycrystalline silicon. Thus, as described in the manufacturing example above, the first bit line, the first source line are connected to the source and drains of the MOS transistor, respectively by self-aligned buried contacts. In addition to forming the polycrystalline silicon wiring at a minimum scale of the design rule, the memory cell array can also be formed at the same minimum value, thereby obtaining a minimized planar area to the memory cell.

In the semiconductor memory device in accordance with the preferred embodiment, the first and second bit and source lines have a two layer structure. Generally, when aluminum is used for the bit lines, alignment problems are caused due to the large size of the aluminum particles and the difficulty in alignment so that it is necessary to increase the alignment space of the surrounding portions. This, in turn, results in a significantly increased size of circuit components, memory cells and the semiconductor memory device. However, in with the present invention, the second bit line (and the second source line) which is aluminum, is formed as a second layer and there is plenty of room to place the wider aluminum wiring without increasing the size of the memory cell which is formed entirely of polycrystalline silicon.

In addition, the power source line which is connected to the sources of the MOS transistors which form the memory cells is connected to the diffusion layer which is the common source for the groups of MOS transistors extended substantially perpendicular to the power source line. The source line connects to the diffusion regions in a buried contact as shown in FIG. 4. As a result, one power source line is sufficient to support a large number of (for example 16) bit lines, thereby reducing the amount of space occupied by the source line and further increasing the miniaturization of the overall semiconductor memory device.

Thus, the semiconductor memory device constructed in accordance with the invention provides a memory cell array which has a minimized dimension which is capable of utilizing the minimum value of the design rule in constructing the memory cells. Moreover, and equally important, in addition to minimizing the size of the memory cell and the overall size of the semiconductor memory device, it is possible to reduce the stray capacitance and increase the speed of the device. Since only the first bit line which is actually selected by the selection circuitry is connected to the second bit line, formed of metal having very low resistance, and a thick insulating layer is otherwise present to separate the metal wiring layer from the other layers, the stray capacitance of the second bit line becomes extremely small. Thus, the semiconductor memory device constructed in accordance with the present invention realizes significant increases in the speed of the reading operation.

The polysilicon wiring used may also include the polycide structure for forming the metal which has a high melting point on the polycrystalline silicon. For example, it is possible to substitute the polycide structure for the first bit line. The first bit line can be formed of metal. However in this case, the size of the first bit line must be larger than that where polycrystalline silicon is used. However, the connection to the source and drain of the MOS transistor is performed by the self-aligned method thereby forming the bit line at the minimum size of the metal.

In FIG. 4, two first bit lines 2 are shown connected to one second bit line through a selection circuit. However, the number of first bit lines coupled to a single second bit line is not limited to this arrangement. However, it is efficient to have two groups of first bit lines select circuits located at the same position, thereby reducing the load carried by the second bit line. It is also efficient to have the selection circuit between the first bit lines, thereby reducing the impedance of the first bit lines and size. In addition, to further reduce the impedance of the first source line, the first source line can be made shorter than the first bit line and connected to the metal second source line.

Figure 7:
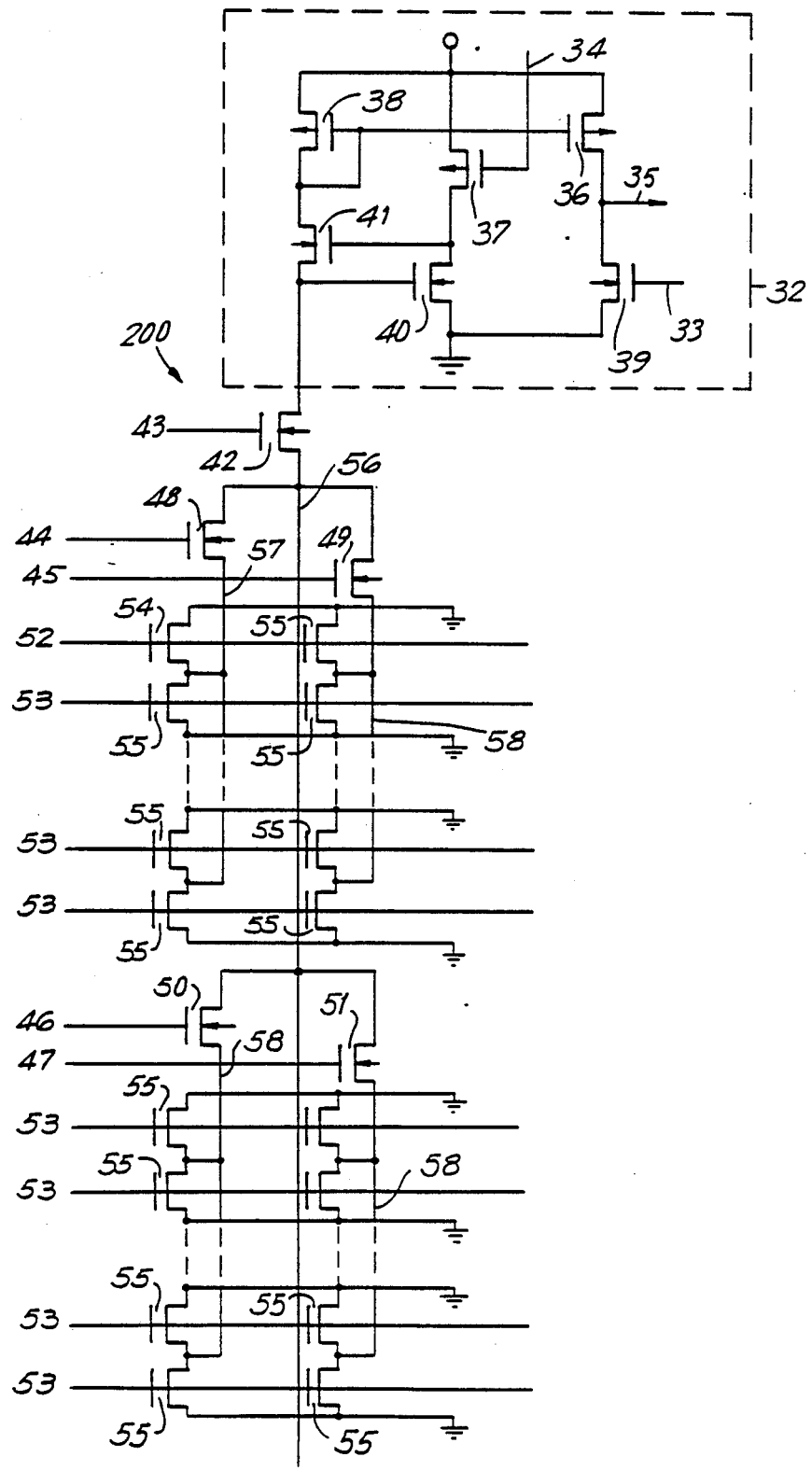
FIG. 7 is a partial circuit diagram of a semiconductor memory device in accordance with a preferred embodiment of the invention.

Reference has been made to FIGS. 4 and 5 with regard to the structure of the memory cells. Reference is now made to FIG. 7 wherein a partial circuit diagram of semiconductor memory device 200 constructed in accordance with a preferred embodiment of the invention is depicted. A sensing amplifier 32, shown as a dotted line in FIG. 7 is one example of a sensing amplifier for detecting data from a bit line. Other sensing amplifiers of known construction can also be used.

Sensing amplifier 32 includes P-channel MOS transistors 36, 37 and 38 and P-channel MOS transistors 39, 40 and 41. The source-drain paths of transistors 38 and 41 are connected in series between a power supply voltage V and the source-drain path of N-channel MOS transistor 42, which selects a second bit line 56 for connection to sensing amplifier 32. The source-drain paths of transistors 37 and 40 are connected in series between power supply voltage V and ground. Likewise, the source-drain paths of transistors 36 and 39 are connected in series between the power supply voltage and ground. The gate electrodes of transistors 36 and 38 are coupled together and to the junction between transistor 38 and transistor 41. The gate electrode of transistor 37 is connected to a reading control signal 34. Reading control signal 34 controls the reading operation and is at a low level when the reading operation is enabled. The gate electrode of transistor 41 is coupled to the junction between transistor 37 and transistor 40. The gate electrode of transistor 40 is coupled to the junction between transistor 41 and transistor 42. The gate electrode of transistor 39 is coupled to input signal 33 which is a reference current level. The output 35 of sensing amplifier 32 is the voltage/current at the junction between transistor 36 and transistor 39.

The gate electrode of N-channel MOS transistor 42 is coupled to column decoder output signal 43 which selectively couples second bit line 56 to sensing amplifier 32. N-channel MOS transistors 48, 49, 50, 51 selectively connect one of the four first bit lines 57, 58 to second bit line 56. The connection enabled by select signals 44, 45, 46, 47. N-channel MOS transistors 54, 55 are the memory cells and lines 52, 53 are the word lines.

For example, when column decoder output signal 43 goes to a high level as a result of the address signal applied to the semiconductor memory device, second bit line 56 is selected. When word line 52 goes to a high level (each of the remaining word lines 53 would remain at a low level) and select line 44 goes to a high level (select lines 45, 46, 47 remaining at a low level) memory cell 54 is selected. Where memory cell 54 has been formed to store data which causes transistor 54 to function properly as an MOS transistor, current flows proportional to the stray capacitance of second bit line 56 from P-channel MOS transistor 38 through N-channel MOS transistor 41, thereby increasing the voltage to a data detection level. As noted, reading control signal 34 is at a low level when a reading operation is to be performed.

The voltage of second bit line 56 at the data detection point is determined by P-channel MOS transistor 37 and N-channel MOS transistor 40. When the voltage on line 56 is low, the gate voltage of N-channel MOS transistor 41 increases, thereby discharging second bit line 56 as second bit line 56 approaches the detection voltage, with substantially the same current flowing through memory cell 54 flowing through P-channel MOS transistor 38. This current is compared by P-channel MOS transistor 36 and N-channel MOS transistor 39 which act as a comparator circuit. This current is compared to the reference current signal input on line 33 to the gate electrode of transistor 39. When memory cell 54 is operating as a functioning MOS transistor, amplifier output 35 outputs a high signal. When memory cell 54 has been created as a transistor which will not allow current to flow, current does not flow in P-channel MOS transistors 38 and 36, and the sensing amplifier output 35 produces a low signal relative to the reference electric current, thereby reading out the binary data. In this way, each of the separate memory cell transistors can be easily selected and connected to sensing amplifier 32 for efficient data retrieval.

The circuit of FIG. 7 is shown with four first bit lines 57, 58 for a single second bit line 56. However, any number of combinations of first and second bit lines can be utilized. The above arrangement has been utilized for purposes of ease of explanation.

The data read out depending upon the state of the memory cell is performed where the potential of the bit line is close to the reference or detecting potential. Thus, the operating speed of the sensing amplifier is related to the time to overcome the voltage potential variation on the column line (bit line). Where the impedance and stray capacitance is high, this can take considerable time. Thus, high speed data reading can be performed by utilizing a memory cell with low impedance and where the stray capacitance of the bit line is extremely small by utilizing the parallel structure.

In addition, the miniaturization of the memory cell also effectively improves the reading operation. When the length of the word and bit line become short, the resistance and stray capacitance thereof are reduced, thereby further improving the speed of the selecting operation by the word line and also the speed of the reading operation in the bit line. Thus, the semiconductor memory device constructed in accordance with applicant's invention provides a particularly high speed device.

As described above, the preferred embodiment of the invention has been described with regard to the use of a mask ROM. However, applicant's invention is not limited to a mask ROM and the present invention is applicable to all semiconductor memory devices utilizing a bit line.

In accordance with the invention, the bit line is composed of the first bit line formed of polycrystalline silicon and a second bit line formed of metal. The first bit line is connected to the memory cell thereby allowing the size of the memory cell to be maintained at the minimum size of the design rule. This has the benefit of producing an improved semiconductor memory device at low cost by reducing the size of the chip.

The first bit line is connected to the second bit line through a selection circuit which also has the effect of substantially reducing the stray capacitance of the bit line without any increase in the area of a memory cell. In addition, by reducing the chip size and accordingly shortening the time required to select or read from the memory device, an improved high speed semiconductor memory device is provided. In addition, since the memory cell array is formed by the self-aligned method, the semiconductor memory device can be produced with high yields and large capacity in an integrated circuit which is suitable for miniaturization without the need for special precautions in the manufacturing process as improvements in the minimum size of the design rule are achieved.

Accordingly, a high speed miniaturized semiconductor memory device which minimizes the stray capacitance on the bit line and maintains the memory cell size at the scale of the design rule is provided.

It will thus be seen that the objects set forth above, among those made apparent from the preceding description, are efficiently attained and, since certain changes may be made in carrying out the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A semiconductor memory device for storing data and selecting data to be read by a sensing amplifier, comprising:
   a plurality of memory cells for storing the data and arranged in a matrix, each memory cell including a MOS transistor having a source electrode and drain electrode;
   word lines arranged in rows;
   a plurality of first bit lines arranged in columns, each first bit line coupled to one of the source electrodes and drain electrodes of a plurality of MOS transistors wherein each column formed by said first bit lines includes at least two first bit lines and wherein the word lines and first bit lines are together operable for selecting one of the memory cells whereby the data stored in the selected memory cell serves as the selected data to be read by the sensing amplifier;
   at least one second bit line, each at least one second bit line selectively coupled to said at least two first bit lines within the same column;
   a power source line coupled to the other of the source electrodes and drain electrodes of a plurality of the MOS transitors; and
   bit line select means for selectively coupling each second bit line to the sensing amplifier.

2. The semiconductor memory device of claim 1 wherein the word lines act as gate electrodes for the MOS transistors forming the memory cells.

3. The semiconductor memory device of claim 1 wherein the first bit lines are formed of polycrystalline silicon.

4. The semiconductor memory device of claim 3 wherein the first bit lines are connected to one of the source and drain electrodes of a plurality of MOS transistors forming the memory cells by buried contacts.

5. The semiconductor memory device of claim 4 wherein the second bit line is formed of metal.

6. The semiconductor memory device of claim 4 wherein the first and second bit lines are formed as separate layers separated by an insulating layer, and further including additional bit line select means for selectively coupling the first and second bit lines together.

7. The semiconductor memory device of claim 3 further including a substrate having a plurality of diffusion areas which serve as the source and drain electrodes and a plurality of contact holes through which the plurality of first bit lines are coupled to the MOS transistors.

8. The semiconductor memory device of claim 1 wherein the first bit lines are formed of metal.

9. The semiconductor memory device of claim 8 further including a substrate having a plurality of diffusion areas which serve as the source and drain electrodes and a plurality of contact holes through which the plurality of first bit lines are coupled to the MOS transistors.

10. The semiconductor memory device of claim 1 wherein the second bit line is formed of metal.

11. The semiconductor memory device of claim 10 wherein the metal is aluminum.

12. The semiconductor memory device of claim 1 wherein the first and second bit lines are formed as separate layers separated by an insulating layer, and further including additional bit line select means for selectively coupling the first and second bit lines together.

13. The semiconductor memory device of claim 1 wherein the power source line includes a plurality of first source lines coupled to the other of the source and drain electrodes of a plurality of MOS transistors and at least one second source line coupled to at least one first source line at a contact.

14. The semiconductor memory device of claim 13 wherein the first source lines are formed of polycrystalline silicon.

15. The semiconductor memory device of claim 14 wherein the at least one second source line is formed of metal.

16. The semiconductor memory device of claim 13 wherein the at least one second source line is formed of metal.

17. The semiconductor memory device of claim 13 wherein the first source lines and the at least one second source line are formed as two layers separated by an insulating layer, except at the contact.

18. A semiconductor memory device for storing data and reading selected data, comprising:
 a plurality of memory cells for storing the data and arranged in a matrix, each memory cell including a MOS transistor having a source diffusion area and a drain diffusion area;
 word lines arranged in rows;
 a plurality of first bit lines arranged in columns, each first bit line electrically coupled to one of the source diffusion areas and drain diffusion areas of a plurality of MOS transistors wherein each column formed from said first bit lines includes at least two first bit lines and wherein the word lines and first bit lines are together operable for selecting one of the memory cells whereby data stored in the selected memory cell serves as the selected data to be read from the device;
 a second bit line selectively electrically coupled to at least two first bit lines;
 first bit line select means for selecting which one of the at least two first bit lines is to be electrically coupled to the second bit line;
 a plurality of first power source lines electrically coupled to the other of the source and drain diffusion areas of a plurality of MOS transistors; and a second power source line electrically coupled to the first power source lines.

19. The semiconductor memory device of claim 18 wherein the first bit lines and the first power source line are arranged on a first layer.

20. The semiconductor memory device of claim 19 wherein the second bit line and the second power source line are arranged on a second layer, the second layer being generally separated from the first layer by an insulating layer.

21. The semiconductor memory device of claim 19 wherein the first bit line and the first power source line are formed of polycrystalline silicon.

22. The semiconductor memory device of claim 19 further including a plurality of contact holes through which the plurality of first bit lines are coupled to the MOS transistors.

23. The semiconductor memory device of claim 18 wherein the second bit line and the second power source line are arranged on a single layer.

24. The semiconductor memory device of claim 23 wherein the second bit line and the second power source line are formed of metal.

25. The semiconductor memory device of claim 18 wherein the first power source line is coupled to the other of the source and drain diffusion areas of a plurality of MOS transistors by buried contacts.

26. The semiconductor memory device of claim 18 wherein the first bit lines and the first power source lines are formed of polycrystalline silicon.

27. The semiconductor memory device of claim 26 wherein the plurality of first bit lines are connected to the source or drain diffusion areas of a plurality of MOS transistors by buried contacts.

28. The semiconductor memory device of claim 26 further including a plurality of contact holes through which the plurality of first bit lines are coupled to the MOS transistors.

29. The semiconductor memory device of claim 18 wherein the second bit line and the second power source line are formed of metal.

30. The semiconductor memory device of claim 29 wherein the first bit line is connected to the source or drain diffusion areas of a plurality of MOS transistors by buried contacts.

31. The semiconductor memory device of claim 18 wherein the plurality of first bit lines are connected to one of the source and drain diffusion areas of the MOS transistors by buried contacts.

32. The semiconductor memory device of claim 18 further comprising a sensing amplifier for detecting the data stored in selected memory cells, the sensing amplifier being selectively coupled to the second bit line.

33. The semiconductor memory device of claim 32 further including means for providing a reference current and wherein the sensing amplifier senses the data in a selected memory cell by comparison between current flowing on the second bit line and the reference current.

34. The semiconductor memory device of claim 18 wherein the MOS transistors further include gate electrodes and wherein the word lines are coupled to the gate electrodes of the MOS transistors.

35. The semiconductor memory device of claim 18 further including a plurality of contact holes through which the plurality of first bit lines are coupled to the MOS transistors.

36. A semiconductor memory device for storing data and reading selected data in combination with means for providing bit line select signals, comprising:

a plurality of memory cells for storing the data and arranged in a matrix, each memory cell including a MOS transistor having source and drain electrodes wherein the matrix includes at least one column having at least two groups, each group including at least two memory cells;

word lines arranged in rows;

a plurality of first bit lines arranged in columns, each first bit line coupled to one of the source electrodes and drain electrodes of a plurality of MOS transistors wherein the word lines and first bit lines are together operable for selecting one of the memory cells;

first bit line selection means including selection MOS transistors, each selection MOS transistor having source, drain and gate electrodes, each of the first bit lines coupled to one of the source and drain electrodes of one of the selection MOS transistors, the gate electrodes of the selection MOS transistors operable for receiving the bit line select signals and the other of the source and drain electrodes of the selection MOS transistors coupled to a common connection;

a second bit line coupled to the common connection; and sensing means coupled to the second bit line for sensing the selected memory cell whereby data stored in the selected memory cell serves as the selected data to be read.

37. The semiconductor memory device of claim 36 wherein the first bit lines are connected to the one of the source and drain electrodes of a plurality of MOS transistors forming the memory cells by buried contacts.

38. The semiconductor memory device of claim 36 wherein the sensing means comprises a sensing amplifier.

39. The semiconductor memory device of claim 38 further including means for providing a reference current and wherein the sensing amplifier reads the data stored in a memory cell by comparing the current flow through the MOS transistor forming the selected memory cell with the level of the reference current.

40. The semiconductor memory device of claim 36 wherein the first bit lines are formed of polycrystalline silicon.

41. The semiconductor memory device of claim 36 wherein the second bit line is formed of metal.

42. The semiconductor memory device of claim 36 further comprising a first power source line coupled to the other of the source and drain electrodes of a plurality of MOS transistors.

43. The semiconductor memory device of claim 42 further comprising a second power source line coupled to the first power source line.

44. The semiconductor memory device of claim 43 wherein the first power source line is formed of polycrystalline silicon and the second power source line is formed of metal.

45. The semiconductor memory device of claim 36 further including a substrate having a plurality of diffusion areas which serve as the source and drain electrodes of the MOS transistors and a plurality of contact holes through which the plurality of first bit lines are coupled to the MOS transistors.

* * * * *